(12) United States Patent
Washizu (10) Patent No.: US 8,897,395 B2
(45) Date of Patent: *Nov. 25, 2014

(54) CLOCK GENERATING APPARATUS, TEST APPARATUS AND CLOCK GENERATING METHOD

(75) Inventor: Nobuei Washizu, Saitama (JP)

(73) Assignee: Advantest Corporation, Tokyo (JP)

( * ) Notice: Subject to any disclaimer, the term of this patent is extended or adjusted under 35 U.S.C. 154(b) by 681 days.

This patent is subject to a terminal disclaimer.

(21) Appl. No.: 13/181,526

(22) Filed: Jul. 13, 2011

(65) Prior Publication Data

US 2012/0182026 A1    Jul. 19, 2012

Related U.S. Application Data

(63) Continuation of application No. PCT/JP2009/001964, filed on Apr. 30, 2009.

(51) Int. Cl.
*H03K 9/00* (2006.01)
*H04L 27/00* (2006.01)
*H04L 7/033* (2006.01)
*H03L 7/08* (2006.01)

(52) U.S. Cl.
CPC ............ *H04L 7/0337* (2013.01); *H03L 7/0807* (2013.01)
USPC ........... 375/316; 375/326; 375/354; 375/371; 375/226; 327/276; 327/277; 327/149; 324/76.11

(58) Field of Classification Search
CPC ........................... H03L 7/0814; H04L 7/0337
USPC .......... 375/316, 326, 354, 371, 226; 327/276, 327/277, 149; 324/76.11; 365/233
See application file for complete search history.

(56) References Cited

U.S. PATENT DOCUMENTS

| 2004/0122620 | A1* | 6/2004 | Doi et al. | 702/182 |
| 2004/0208048 | A1* | 10/2004 | Doi et al. | 365/145 |
| 2004/0251914 | A1* | 12/2004 | Doi et al. | 324/537 |
| 2005/0219937 | A1* | 10/2005 | Sato | 365/233 |

FOREIGN PATENT DOCUMENTS

| CN | 1476194 A | 2/2004 |
| JP | S59-171233 A | 9/1984 |
| JP | 2003-315428 A | 11/2003 |
| JP | 2004-127455 A | 4/2004 |

OTHER PUBLICATIONS

Notification of First Office Action for Chinese Patent Application Filing No. 2009801581381, issued by the State Intellectual Property Office of the P.R. China on Sep. 27, 2013.
Notice of rejection issued by the Japanese Patent Office for application No. 2011-511190, Jan. 8, 2013.

* cited by examiner

*Primary Examiner* — Sam K Ahn
*Assistant Examiner* — Fabricio R Murillo Garcia (57) ABSTRACT

There is provided a clock generating apparatus for generating a recovered clock by recovering a clock from an edge of a received signal, including a recovered clock generating section that generates the recovered clock, a multi-strobe generating section that generates a plurality of strobes with different phases, in accordance with a pulse of the recovered clock, a detecting section that detects a position of an edge of the received signal relative to the strobes, by referring to values of the received signal obtained at respective timings of the strobes, and an adjusting section that adjusts a phase of the recovered clock, in accordance with the position of the edge of the received signal.

10 Claims, 11 Drawing Sheets

CLOCK GENERATING APPARATUS, TEST APPARATUS AND CLOCK GENERATING METHOD

BACKGROUND

1. Technical Field

The present invention relates to a clock generating apparatus, a test apparatus, and a clock generating method.

2. Related Art

A known device (for example, DDR-SDRAM) outputs in parallel a data signal and a clock signal representing when to obtain the data signal. When designed to test such a device, a test apparatus utilizes multi-strobe capability to test the relation between the phase of the data signal and the phase of the clock signal.

Patent Document 1: Japanese Patent Application Publication No. 2003-315428

Patent Document 2: Japanese Patent Application Publication No. 2004-127455

To test a device configured to output in parallel a data signal and a clock signal, a test apparatus needs to adjust, in advance of the test, multiple strobes so that the strobes are generated at appropriate timings. The test apparatus, however, has difficulties in performing the adjustment automatically.

Another known device outputs a signal obtained by superimposing a clock component onto a data signal (for example, a device compatible with the serial ATA I/F standard). To test such a device, a test apparatus needs to recover the clock from the data signal output from the device. The test apparatus, however, cannot test such a device since it cannot automatically recover the clock from the data signal despite its multi-strobe capability.

In the future, a device can be proposed that outputs in parallel a data signal and a clock signal between which the relation in phase is indeterminate. To test such a device, a test apparatus needs to recover, in advance of the test, the clock from the data and clock signals output from the device. When testing such a device using the multi-strobe capability, however, the test apparatus is required to perform complicated clock pull-in process.

SUMMARY

To solve the above-described problems, a first aspect of the innovations may include a clock generating apparatus for generating a recovered clock by recovering a clock from an edge of a received signal, including a recovered clock generating section that generates the recovered clock, a multi-strobe generating section that generates a plurality of strobes with different phases, in accordance with a pulse of the recovered clock, a detecting section that detects a position of an edge of the received signal relative to the strobes, by referring to values of the received signal obtained at respective timings of the strobes, and an adjusting section that adjusts a phase of the recovered clock, in accordance with the position of the edge of the received signal. The first innovations also includes a test apparatus and a clock generating method.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
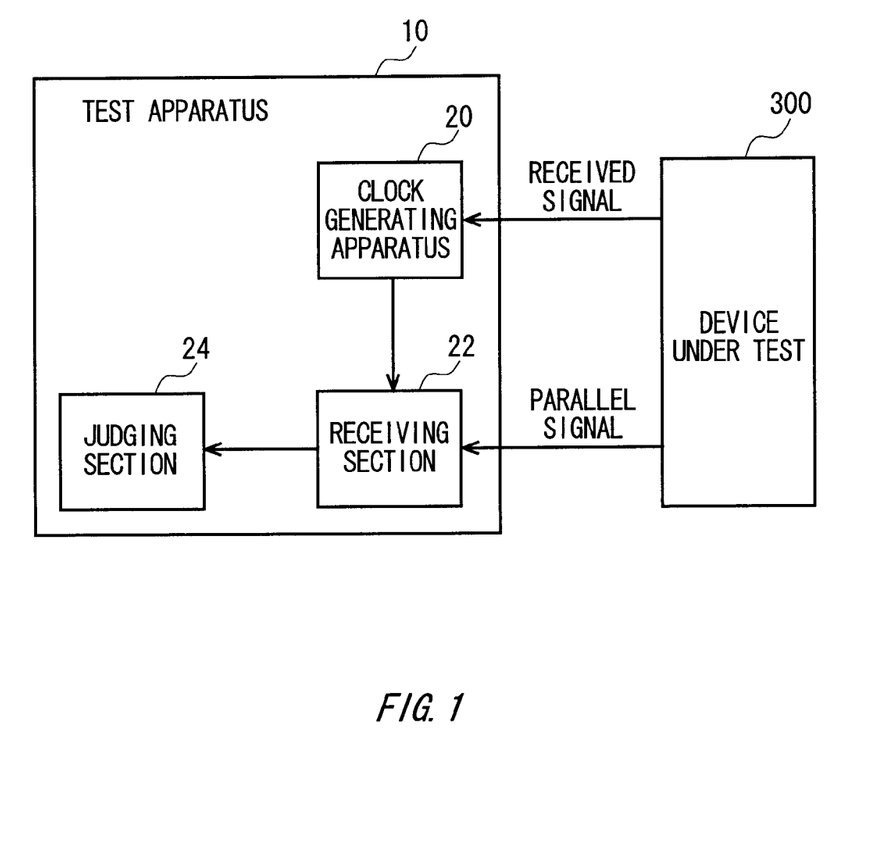
FIG. 1 illustrates the configuration of a test apparatus 10 relating to an embodiment of the present invention, together with a device under test 300.

FIG. 1 illustrates the configuration of a test apparatus 10 relating to an embodiment of the present invention, together with a device under test 300. The test apparatus 10 is designed to test the device under test 300. The device under test 300 transmits a received signal and a parallel signal that is transferred in parallel with the received signal, for example.

The device under test 300 may be double-data-rate synchronous dynamic random access memory (DDR-SDRAM) or the like, for example. When the device under test 300 is DDR-SDRAM, the parallel signal is a data signal and the received signal is a clock signal that indicates when to obtain the data signal. The device under test 300 may be alternatively configured not to transmit the parallel signal, in which case the received signal is a clock embedded signal.

The test apparatus 10 includes a clock generating apparatus 20, a receiving section 22, and a judging section 24. The clock generating apparatus 20 recovers the edge from the received signal received from the device under test 300 to generate a recovered clock. The receiving section 22 receives at least one of the received signal and the parallel signal transmitted from the device under test 300 in parallel with the received signal, in accordance with the recovered clock generated by the clock generating section 20. The judging section 24 judges whether the signal received by the receiving section 22 is acceptable.

Figure 2:
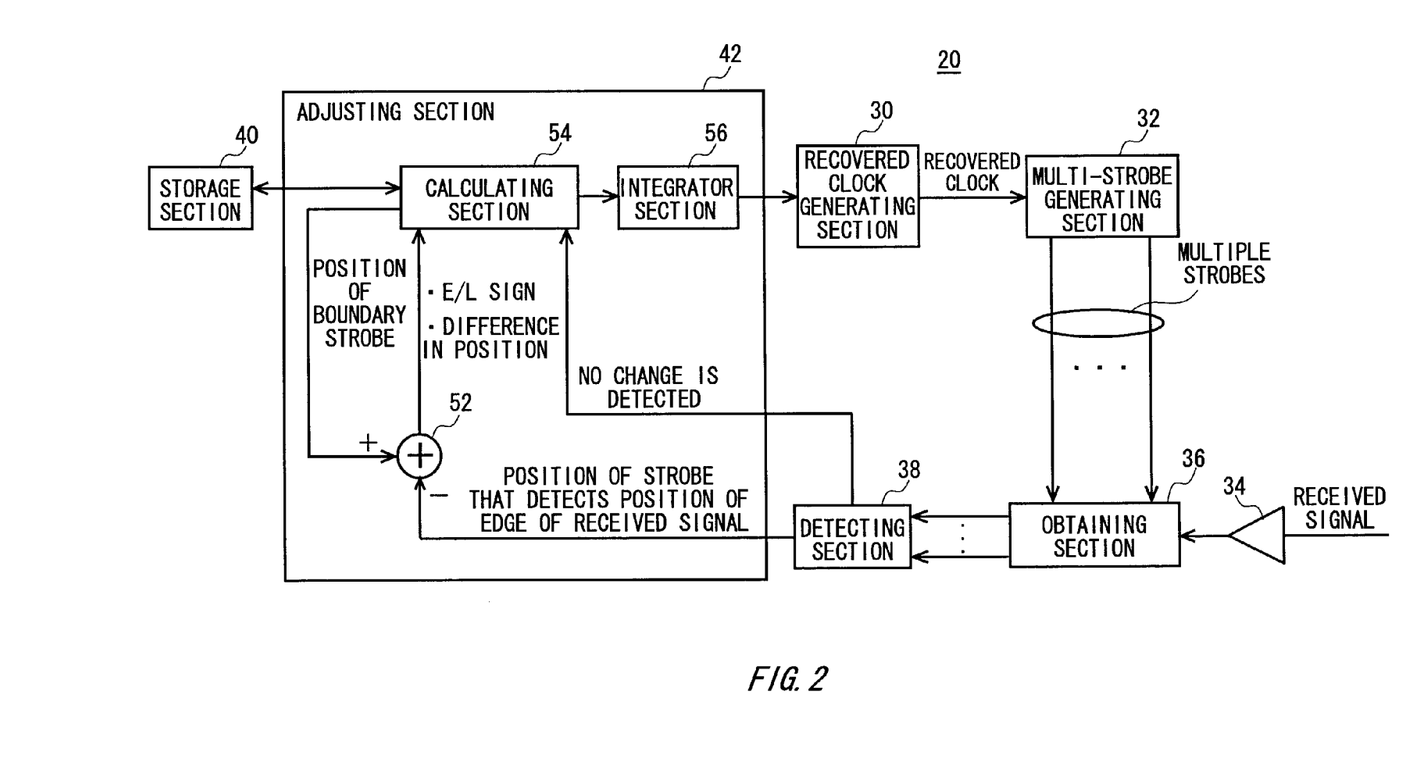
FIG. 2 illustrates the configuration of a clock generating apparatus 20 relating to the embodiment.

FIG. 2 illustrates the configuration of the clock generating apparatus 20 relating to the embodiment. The clock generating apparatus 20 recovers a clock from the edge of the received signal.

The clock generating apparatus 20 includes a recovered clock generating section 30, a multi-strobe generating section 32, a level comparator 34, an obtaining section 36, a detecting section 38, a storage section 40 and an adjusting section 42. The recovered clock generating section 30 generates a recovered clock. The recovered clock generating section 30 varies the phase of the recovered clock, according to a control amount supplied from the adjusting section 42.

The multi-strobe generating section 32 generates a plurality of strobes with different phases, in accordance with a pulse of the recovered clock. For example, the multi-strobe generating section 32 generates a plurality of strobes that are each delayed by a predetermined time relative to the reference phase of the recovered clock.

The level comparator 34 compares the level of the received signal input from outside against the level of a threshold value and outputs the received signal in the form of a logic value. The obtaining section 36 obtains the value of the received signal output from the level comparator 34 at each of the timings indicated by the strobes generated by the multi-strobe generating section 32.

The detecting section 38 uses the values of the received signal, which are obtained by the obtaining section 36, at the respective timings indicated by the strobes to detect the position of the edge of the received signal relative to the strobes. Specifically speaking, the detecting section 38 identifies which one of the strobes detects the position of the edge of the received signal, by identifying the point of the change among the chronologically arranged values of the received signal.

The detecting section 38 outputs to the adjusting section 42 the position of the strobe that detects the position of the edge of the received signal. Furthermore, when detecting, between any two adjacent strobes, no change among the values of the received signal, the detecting section 38 outputs to the adjusting section 42 information indicating that no change is detected.

The storage section 40 stores therein a reference time amount by which the phase of the recovered clock is shifted by the adjusting section 42. The reference delay amount stored in the storage section 40 is rewritten by the adjusting section 42 as appropriate.

The adjusting section 42 adjusts the phase of the recovered clock in accordance with the position of the edge of the received signal. More specifically, the adjusting section 42 adjusts the phase of the recovered clock by supplying the recovered clock generating section 30 with a control amount that is determined so as to align the position of the predetermined boundary strobe selected from among the strobes with the position of the edge of the received signal. The position of the boundary strobe may be the position of one of the strobes or the position between two adjacent ones of the strobes. The position of the boundary strobe can be varied from outside, for example.

The adjusting section 42 includes, for example, a difference calculating section 52, a calculating section 54, and an integrator section 56. The difference calculating section 52 detects (i) the difference between the position of the boundary strobe and the position of the strobe that detects the position of the edge of the received signal, and (ii) an E/L sign representing which one of the position of the edge of the received signal and the position of the boundary strobe is temporally ahead of the other.

For example, the difference calculating section 52 outputs a sign representing EARLY when the position of the boundary strobe is ahead the position of the edge of the received signal. On the other hand, the difference calculating section 52 outputs a sign representing LATE when the position of the boundary strobe is behind the position of the edge of the received signal.

The calculating section 54 generates in each cycle a control amount used for adjusting the phase of the recovered clock, by referring to the difference in position and the E/L sign, which are detected by the difference calculating section 52, the information indicating that no change is detected, which is received from the detecting section 38, and the reference time amount stored in the storage section 40. How to generate the control amount will be described in more detail with reference to FIG. 3 and subsequent drawings.

The integrator section 56 calculates the integral of the control amount and supplies the result to the recovered clock generating section 30. For example, the integrator section 56 may apply low-pass filtering to the control amount output in each cycle and supply the result to the recovered clock generating section 30.

Within each cycle, the above-described clock generating apparatus 20 generates a plurality of strobes, detects the position of the edge of the received signal using the strobes, and adjusts the phase of the recovered clock. Here, the cycle has the same duration as the period of the recovered clock or the predetermined multiple of the period of the recovered clock. In this way, the clock generating apparatus 20 can generate a recovered clock in synchronization with the phase of the position of the edge of the received signal.

Figure 3:
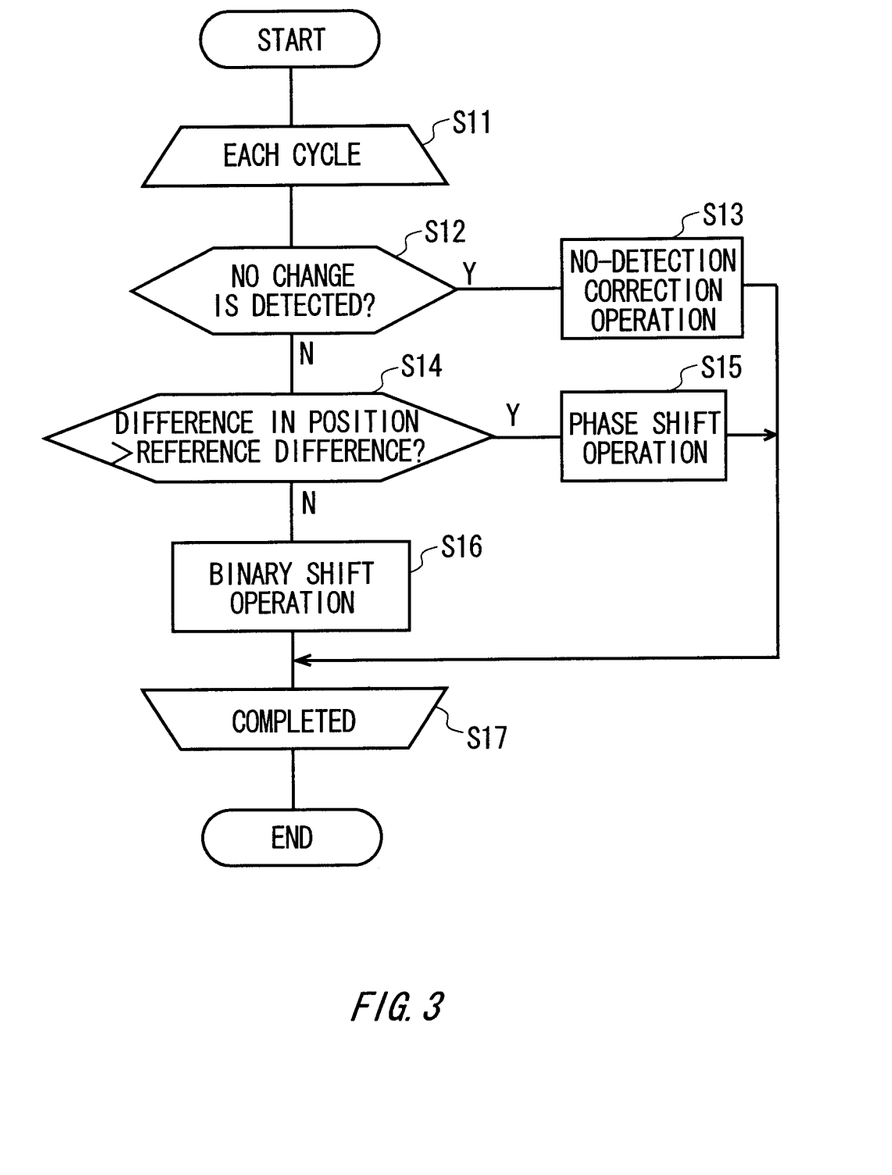
FIG. 3 is a flow chart illustrating how an adjusting section 42 adjusts the phase of a recovered clock, in accordance with the embodiment.

FIG. 3 is a flow chart illustrating how the adjusting section 42 adjusts the phase of the recovered clock, in accordance with the embodiment. The adjusting section 42 performs the series of steps S12 to S16 within each cycle (S11 and S17). Here, the cycle corresponds to the period of the recovered clock or the predetermined multiple of the period of the recovered clock.

To begin with, in the step S12, the adjusting section 42 judges whether no change among the values of the received signal is detected between any two adjacent ones of the strobes. When no change is detected (Yes: S12), the adjusting section 42 proceeds to the step S13 to perform a no-detection correction operation. The no-detection correction operation will be described in more detail with reference to FIG. 4. When a change is detected (No: S12), the adjusting section 42 proceeds to the step S14.

In the following step S14, the adjusting section 42 judges whether a predetermined reference difference is exceeded by the difference between the position of one of the strobes that detects the position of the edge of the received signal and the position of a predetermined boundary strobe selected from among the strobes. The reference difference may be, for example, one strobe. In this case, the adjusting section 42 judges whether the difference between the position of the strobe that detects the position of the edge and the position of the boundary strobe is more than 1 strobe, or equal to or less than 1 strobe.

When the difference in position exceeds the reference difference (Yes: S14), the adjusting section 42 proceeds to the step S15 and performs a phase shift operation. The phase shift operation will be described in more detail with reference to FIGS. 5 and 6. When the difference in position does not exceed the reference difference (No: S14), the adjusting section 42 proceeds to the step S16 to perform a binary shift operation. The binary shift operation will be described in more detail with reference to FIGS. 7 to 9.

After the steps S13, S14, or S16, the adjusting section 42 returns to the step S12 (S17). The adjusting section 42 repeatedly performs the above-described series of steps S12 to S16 in each cycle until the clock generating apparatus 20 stops operating (S11, S17).

The adjusting section 42 may be configured to skip the phase shift operation of the step S15. In this case, when judging that a change is detected in the step S12 (No: S12), the adjusting section 42 proceeds to the step S16 without making the judgment in the step S14.

Furthermore, the adjusting section 42 may be configured to skip the binary shift operation of the step S16. In this case, when judging that a change is detected in the step S12 (No: S12), the adjusting section 42 proceeds to the step S15 without making the judgment in the step S14.

Figure 4:
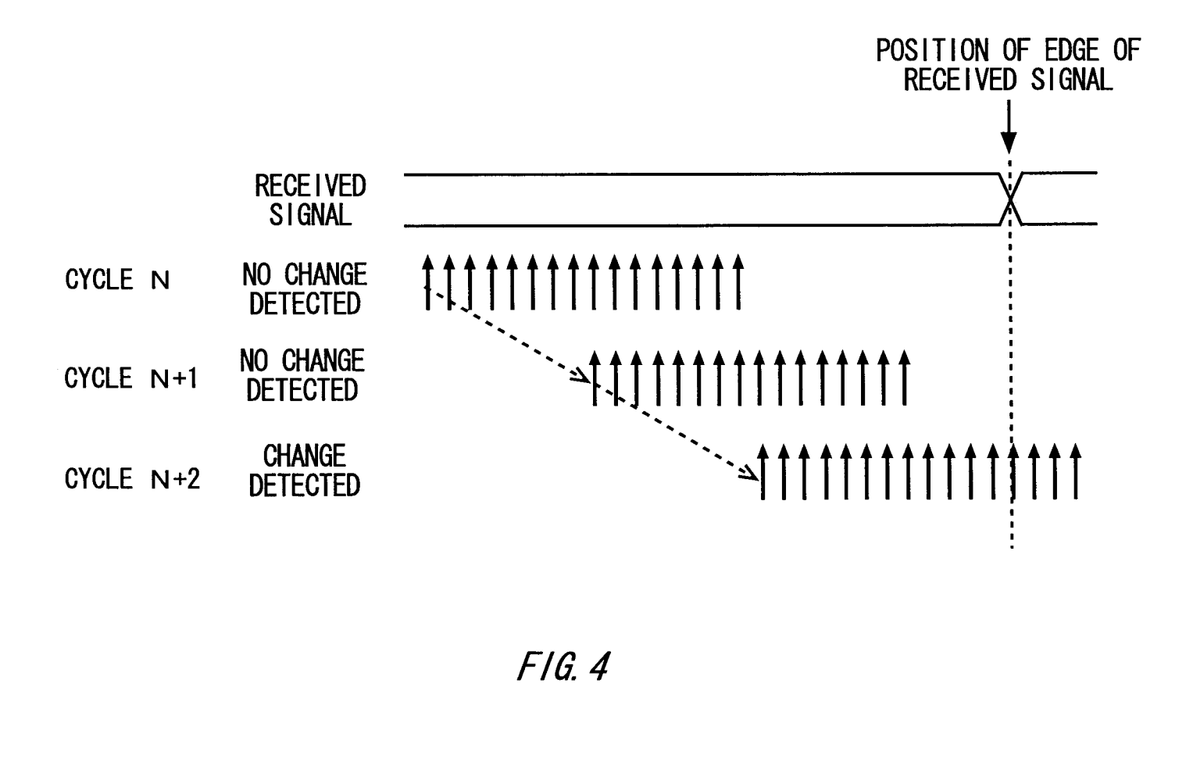
FIG. 4 illustrates, as an example, a no-detection correction operation performed in a step S13 of FIG. 3.

FIG. 4 illustrates, as an example, the no-detection correction operation performed in the step S13 of FIG. 3. The adjusting section 42 performs the no-detection correction operation if the change among the values of the received signal is not detected between any two adjacent strobes.

The adjusting section 42 performs the no-detection correction operation by delaying or advancing the phase of the recovered clock relative to the received signal. For example, the adjusting section 42 delays or advances the phase of the recovered clock by a time less than the time interval between the initial strobe and the last strobe of the strobes. For example, the adjusting section 42 may shift the phase of the recovered clock by a time equal to half the time interval between the initial strobe and the last strobe.

By repeatedly performing the no-detection correction operation in each cycle, the adjusting section 42 can detect, between any two adjacent strobes, the change among the values of the received signal eventually in a certain cycle. In this way, the adjusting section 42 can reliably move the position of the edge of the received signal so that the position of the edge of the received signal falls within the range between the initial strobe and the last strobe.

Figure 5:
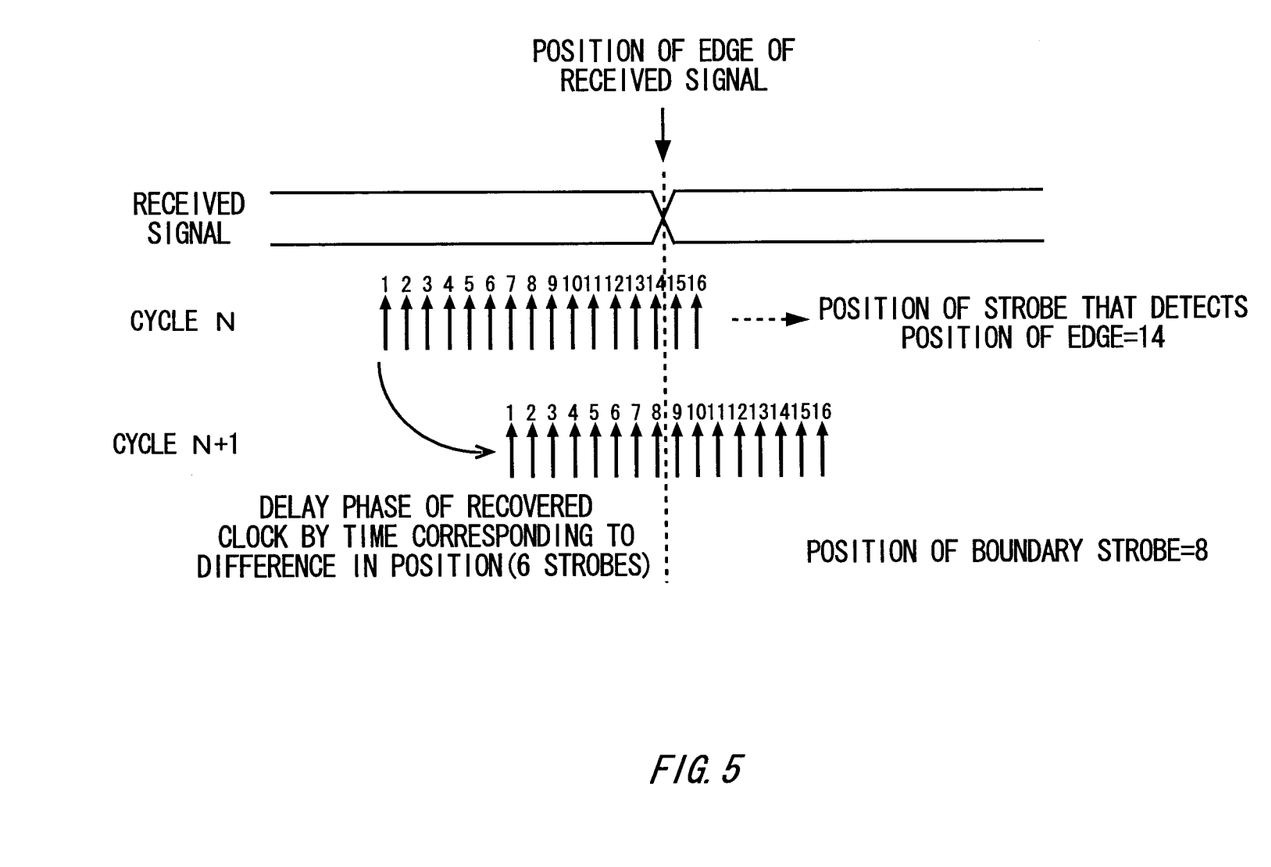
FIG. 5 illustrates, as an example, a phase shift operation performed when the position of a boundary strobe is ahead the position of the edge of a received signal.
Figure 6:
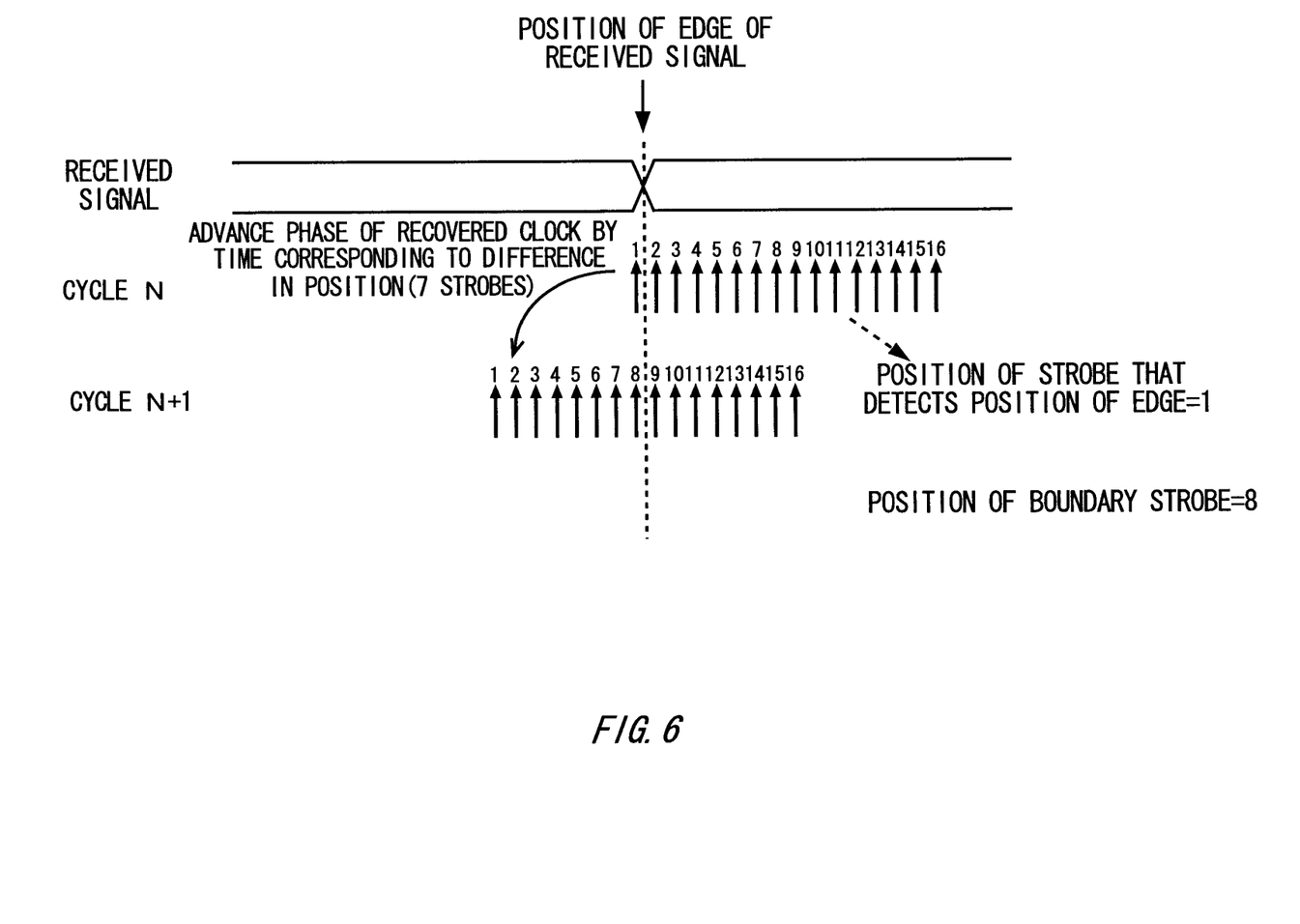
FIG. 6 illustrates, as an example, a phase shift operation performed when the position of the boundary strobe is behind the position of the edge of the received signal.

FIGS. 5 and 6 illustrate, as an example, the phase shift operation performed in the step S15 of FIG. 3. FIG. 5 illustrates, as an example, a phase shift operation performed when the position of the boundary strobe is ahead the position of the edge of the received signal. FIG. 6 illustrates, as an example, a phase shift operation performed when the position of the boundary strobe is behind the position of the edge of the received signal.

The adjusting section 42 performs the phase shift operation if the change among the values of the received signal is detected between any two adjacent strobes and if the reference difference is exceeded by the difference between the position of the boundary strobe and the position of the strobe that detects the position of the edge of the received signal. The adjusting section 42 performs the phase shift operation by shifting the phase of the recovered clock by a time corresponding to the difference between the position of the strobe that detects the position of the edge of the received signal and the position of the boundary strobe. Here, the adjusting section 42 shifts the phase of the recovered clock in such a manner that the position of the boundary strobe approaches the position of the edge of the received signal.

For example, when the position of the boundary strobe is ahead the position of the edge of the received signal (i.e., when the detected sign indicates EARLY), the adjusting section 42 delays the phase of the recovered clock by the time corresponding to the difference between the position of the strobe that detects the position of the edge of the received signal and the position of the boundary strobe. For example, as shown in FIG. 5, a case is assumed where there are 16 strobes, the 14th strobe detects the position of the edge of the received signal and the boundary strobe is the 8th strobe. In this case, the adjusting section 42 delays the phase of the recovered clock by the time corresponding to 6 (=14−8) strobes.

As another example, when the position of the boundary strobe is behind the position of the edge of the received signal (i.e., when the detected sign indicates LATE), the adjusting section 42 advances the phase of the recovered clock by the time corresponding to the difference between the position of the strobe that detects the position of the edge of the received signal and the position of the boundary strobe. For example, as shown in FIG. 6, a case is assumed where there are 16 strobes, the first strobe detects the position of the edge of the received signal and the boundary strobe is the 8th strobe. In this case, the adjusting section 42 advances the phase of the recovered clock by the time corresponding to 7 (=8−1) strobes.

In the above-described manner, the adjusting section 42 can correct the phase of the recovered clock in such a manner that the position of the boundary strobe moves closer to the position of the edge of the received signal. For example, in the examples shown in FIGS. 5 and 6, the adjusting section 42 can adjust the phase of the recovered clock in such a manner that the position of the boundary strobe moves to fall within the reference difference (within +−1 strobe) from the position of the edge of the received signal. In this manner, the adjusting section 42 can reliably synchronize the position of the edge of the received signal with the position of the predetermined boundary strobe.

Figure 7:
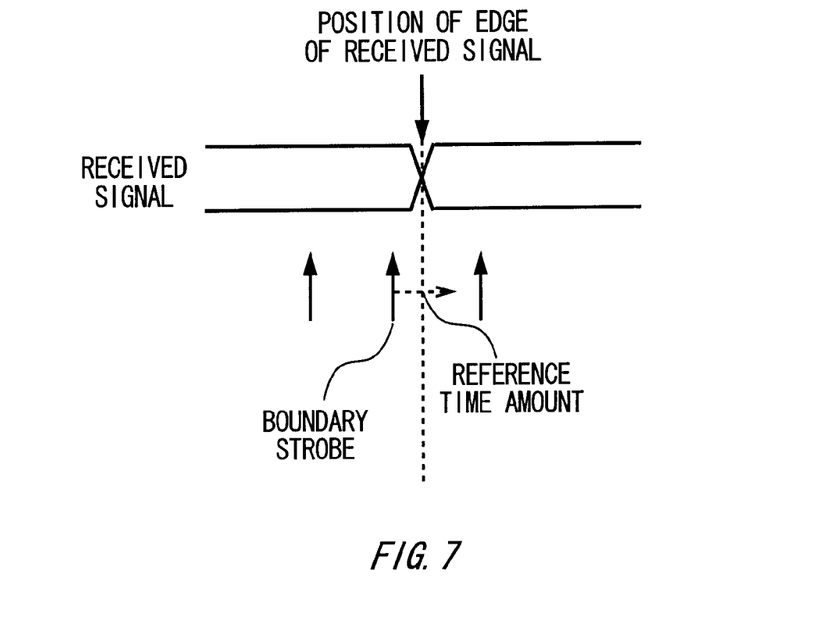
FIG. 7 illustrates, as an example, a binary shift operation performed when the position of the boundary strobe is ahead the position of the edge of the received signal.
Figure 8:
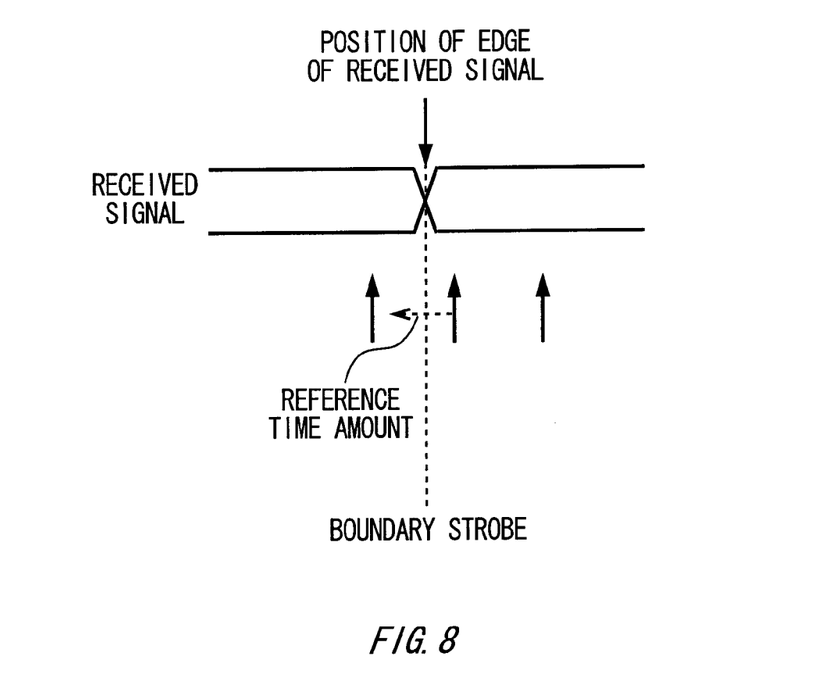
FIG. 8 illustrates, as an example, a phase shift operation performed when the position of the boundary strobe is behind the position of the edge of the received signal.

FIGS. 7 and 8 illustrate, as an example, the binary shift operation performed in the step S16 of FIG. 3. FIG. 7 illustrates, as an example, a binary shift operation performed when the position of the boundary strobe is ahead the position of the edge of the received signal. FIG. 8 illustrates, as an example, a phase shift operation performed when the position of the boundary strobe is behind the position of the edge of the received signal.

The adjusting section 42 performs the binary shift operation if the change among the values of the received signal is detected between any two adjacent strobes, and if the reference difference is not exceed by the difference between the position of the boundary strobe and the position of the strobe that detects the position of the edge of the received signal. In other words, the adjusting section 42 performs the binary shift operation when the difference between the position of the boundary strobe and the position of the strobe that detects the position of the edge of the received signal is equal to or less than the reference difference.

The adjusting section 42 performs the binary shift operation by shifting the phase of the recovered clock by the reference time amount stored in the storage section 40. Here, the adjusting section 42 shifts the phase of the recovered clock by the reference time amount in such a manner that the position of the boundary strobe approaches the position of the edge of the received signal.

For example, when the position of the boundary strobe is ahead the position of the edge of the received signal as shown in FIG. 7 (i.e., when the detected sign indicates EARLY), the adjusting section 42 delays the phase of the recovered clock by the reference time amount stored in the storage section 40. On the other hand, when the position of the boundary strobe is behind the position of the edge of the received signal as shown in FIG. 8 (i.e., when the detected sign indicates LATE), the adjusting section 42 advances the phase of the recovered clock by the reference time amount stored in the storage section 40.

During the binary shift operation, the adjusting section 42 halves the reference time amount stored in the storage section 40 if shifting the phase of the recovered clock by the reference time amount reverses the temporal order of the position of the edge of the received signal and the position of the boundary strobe. For example, the adjusting section 42 halves the reference time amount stored in the storage section 40 if the value of the E/L sign is reversed. Thus, when the time difference is small between the position of the edge of the received signal and the position of the boundary strobe, the adjusting section 42 decreases the change by which the phase of the recovered clock is shifted so that the time difference between the position of the edge of the received signal and the position of the boundary strobe can be further decreased.

During the binary shift operation, the adjusting section 42 doubles the reference time amount stored in the storage section 40 if the phase of the recovered clock is successively delayed or advanced by the same reference time amount a predetermined number of times. For example, the adjusting section 42 doubles the reference time amount stored in the storage section 40, when detecting the same value for the E/L sign twice in a row. Thus, when the time difference is large between the position of the edge of the received signal and the position of the boundary strobe, the adjusting section 42 can increase the change by which the phase of the recovered clock is shifted so that the position of the boundary strobe can approach the position of the edge of the received signal within a shorter period of time.

In the above-described manner, the adjusting section 42 can accurately align the position of the predetermined boundary strobe with the position of the edge of the received signal. Furthermore, the adjusting section 42 can complete the alignment of the position of the boundary strobe with the position of the edge of the received signal within a short period of time.

Figure 9:
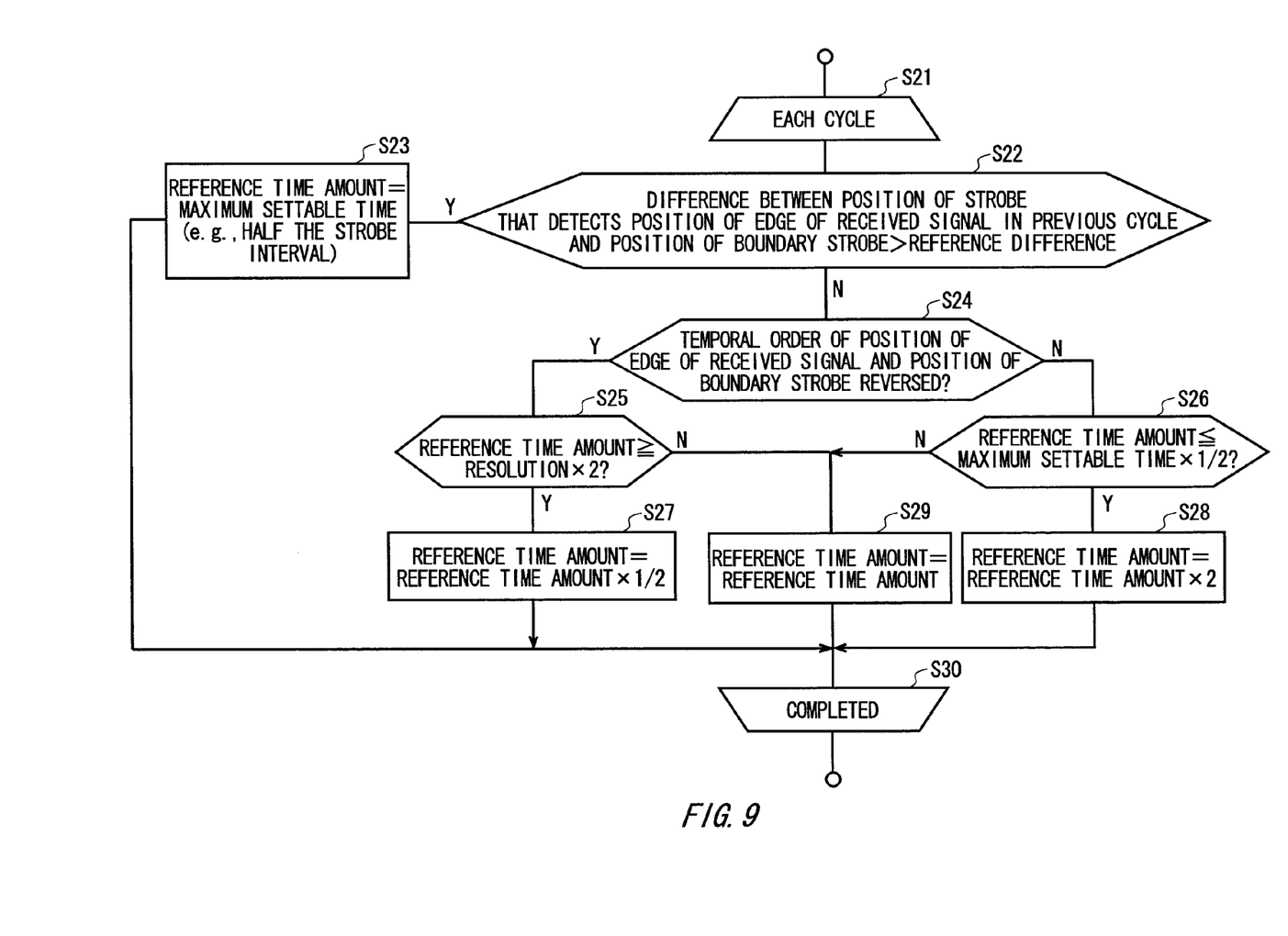
FIG. 9 is a flow chart illustrating, as an example, how the adjusting section calculates a reference time amount used for the binary shift operation in accordance with the embodiment.

FIG. 9 is a flow chart illustrating, as an example, how the adjusting section 42 calculates the reference time amount used for the binary shift operation in accordance with the embodiment. During the binary shift operation, the adjusting section 42 performs the series of steps S22 to S29 in each cycle to rewrite the reference time amount stored in the storage section 40 (S21 and S30).

To begin with, in the step S22, the adjusting section 42 judges whether the reference difference is exceeded by the difference between the position of the strobe that detects the position of the edge of the received signal in the previous cycle and the position of the boundary strobe. When judging that the reference difference is exceeded by the difference in position in the previous cycle (Yes: S22), the adjusting section 42 proceeds to the step S23. When judging that the reference difference is not exceeded by the difference in position in the previous cycle (No: S22), the adjusting section 42 proceeds to the step S24.

In the step S23, the adjusting section 42 rewrites the reference time amount stored in the storage section 40 to a maximum settable time. For example, the maximum settable time may be equal to half the reference difference. For example, when the reference difference is 1 strobe, the maximum settable time may be equal to half the strobe interval.

In the step S24, the adjusting section 42 judges whether the temporal order of the position of the edge of the received signal and the position of the boundary strobe is reversed. For example, when the value of the E/L sign is opposite to its value of the previous cycle, the adjusting section 42 judges that the temporal order of the position of the edge of the received signal and the position of the boundary strobe is opposite to its temporal order of the previous cycle.

When judging that the temporal order of the position of the edge of the received signal and the position of the boundary strobe is reversed (Yes: S24), the adjusting section 42 proceeds to the step S25. When judging that the temporal order of the position of the edge of the received signal and the position of the boundary strobe is not reversed (No: S24), the adjusting section 42 proceeds to the step S26.

In the step S25, the adjusting section 42 judges whether the reference time amount stored in the storage section 40 is equal to or greater than double a resolution. Here, the resolution may be the minimum time amount by which the recovered clock generating section 30 can shift the phase of the recovered clock, for example. When judging that the reference time amount stored in the storage section 40 is equal to or greater than double the resolution (Yes: S25), the adjusting section 42 proceeds to the step S27. When judging that the reference time amount stored in the storage section 40 is less than double the resolution (No: S25), the adjusting section 42 proceeds to the step S29.

In the step S26, the adjusting section 42 judges whether the reference time amount stored in the storage section 40 is equal to or less than half the maximum settable time. When judging that the reference time amount stored in the storage section 40 is equal to or less than half the maximum settable time (Yes: S26), the adjusting section 42 proceeds to the step S28. When judging that the reference time amount stored in the storage section 40 is greater than half the maximum settable time (No: S26), the adjusting section 42 proceeds to the step S29.

In the step S27, the adjusting section 42 rewrites and halves the reference time amount stored in the storage section 40. In this way, the adjusting section 42 can halve the reference time amount stored in the storage section 40 when shifting the phase of the recovered clock by the reference time amount reverses the temporal order of the position of the edge of the received signal and the position of the boundary strobe.

In the step S28, the adjusting section 42 rewrites and doubles the reference time amount stored in the storage section 40. In this manner, the adjusting section 42 can double the reference time amount stored in the storage section 40 when the phase of the recovered clock is successively advanced or delayed by the same reference time amount a predetermined number of times.

In the step S29, the adjusting section 42 does not rewrite the reference time amount stored in the storage section 40 and leaves the stored value without a change. In this way, the adjusting section 42 can prevent the reference time amount from becoming equal to or less than the resolution. In addition, the adjusting section 42 can prevent the reference time amount from becoming equal to or greater than the maximum settable time.

After completing the steps S23 and S27 to S29, the adjusting section 42 returns to the step S22 (S30). Thus, the adjusting section 42 repeatedly performs the above-described series of steps S22 to S20 in each cycle until the clock generating apparatus 20 stops operating (S21, S30).

Figure 10:
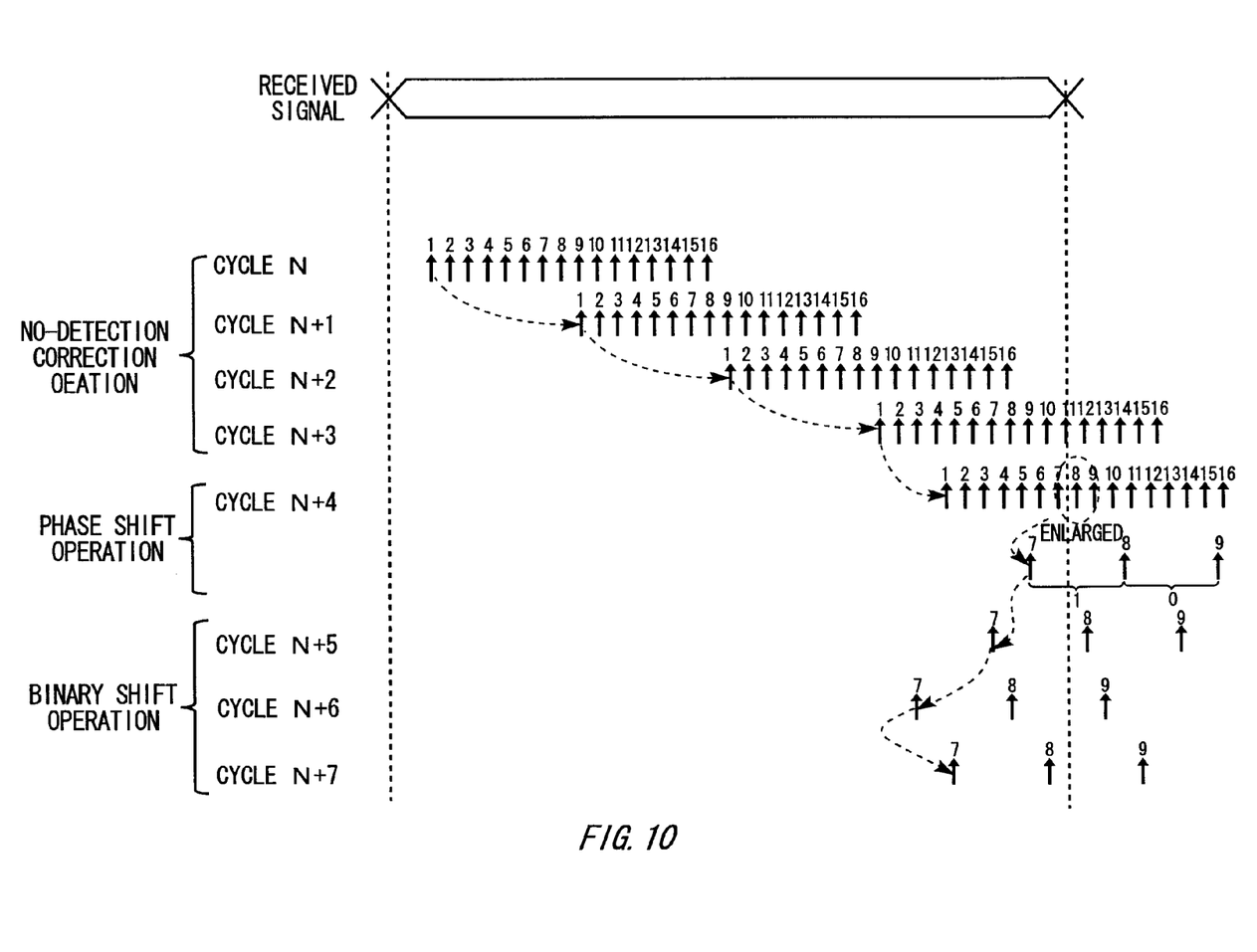
FIG. 10 illustrates, as an example, how the positions of multiple strobes change over cycles.

FIG. 10 illustrates, as an example, how the positions of the multiple strobes change over cycles. The position of the edge of the received signal is not detected between any two adjacent strobes of the strobes in any of the cycles N to N+3. Accordingly, in each of the cycles N to N+3, the adjusting section 42 performs the no-detection correction operation. Specifically speaking, in each of the cycles N to N+3, the adjusting section 42 delays the phase of the recovered clock, relative to the received signal, by the time less than the time interval between the initial strobe and the last strobe (for example, by the time corresponding to 8 strobes)

In the following cycle N+4, the 11th strobe detects the position of the edge of the received signal. Since the boundary strobe is the 8th strobe, the difference is 3 strobes between the position of the boundary strobe and the position of the strobe that detects the position of the edge of the received signal and thus exceeds the reference difference (i.e., 1 strobe). Accordingly, the adjusting section 42 performs the phase shift operation in the cycle N+4. Specifically speaking, in the cycle N+4, the adjusting section 42 delays the phase of the recovered clock by the time corresponding to 3 strobes.

In the subsequent cycles N+5 to N+7, the 8th or 9th strobe detects the position of the edge of the received signal. Thus, the difference is no more than the reference difference (i.e., 1 strobe) between the position of the boundary strobe (8th) and the position of the strobe that detest the position of the edge of the received signal. Accordingly, the adjusting section 42 performs the binary shift operation in the cycles N+5 to N+7. Specifically speaking, in each of the cycles N+5 to N+7, the adjusting section 42 shifts the phase of the recovered clock by the reference time amount stored in the storage section 40 in such a manner that the position of the boundary strobe approaches the position of the edge of the received signal.

As described above, the adjusting section 42 performs the non-detection correction operation, the phase shift operation, and the binary shift operation in the stated order to bring the position of the boundary strobe closer to the position of the edge of the received signal. In this manner, the adjusting section 42 can perform reliable pull-in process for synchronizing the strobes with the position of the edge of the received signal.

Figure 11:
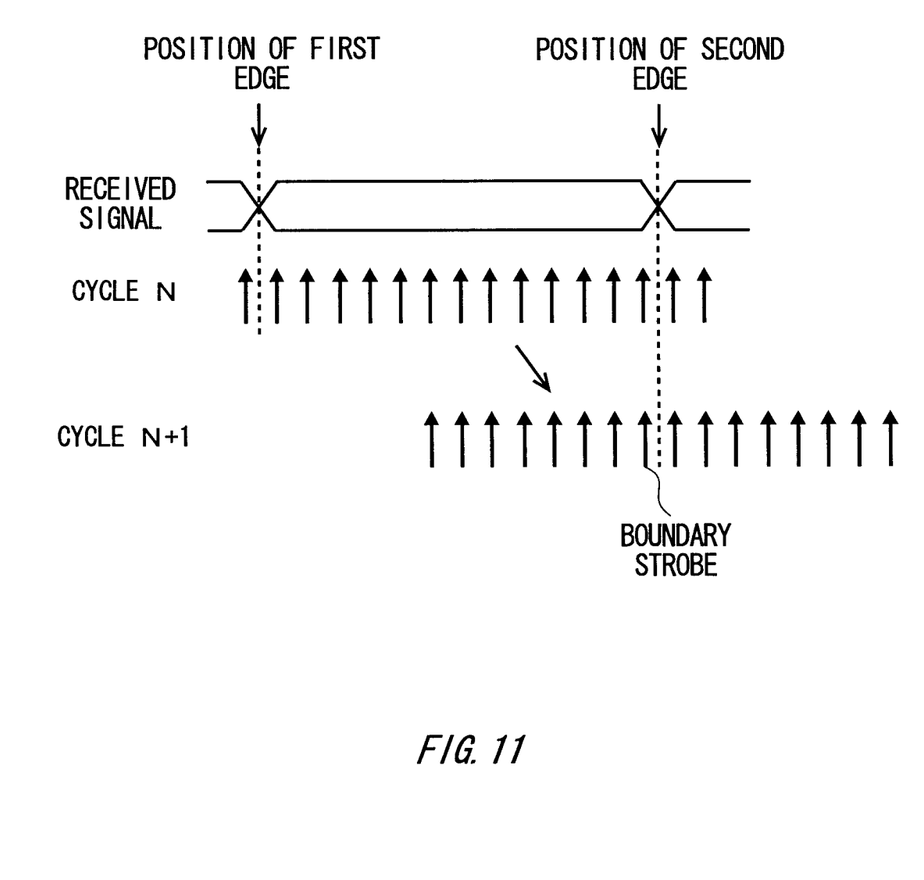
FIG. 11 illustrates, as an example, the relation between a received signal and multiple strobes when two or more edges of the received signal are detected by the set of strobes.

FIG. 11 illustrates, as an example, the relation between a received signal and multiple strobes when two or more edges of the received signal are detected by the set of strobes. When two or more edges of the received signal are detected by the set of strobes, for example, the adjusting section 42 adjusts the position of the boundary strobe so that the position of the boundary strobe is aligned with the position of the n-th edge from the first or last among the detected edges, where n denotes a predetermined number.

In the example of FIG. 11, the adjusting section 42 performs the phase shift operation by delaying the phase of the recovered clock by the time corresponding to the difference between the position of the strobe that detects the second edge from the first among the detected edges and the position of the boundary strobe. In this way, the adjusting section 42 can reliably synchronize the phase of the recovered clock with the position of the edge of the received signal even if two or more edges of the received signal are detected by the set of strobes.

Figure 12:
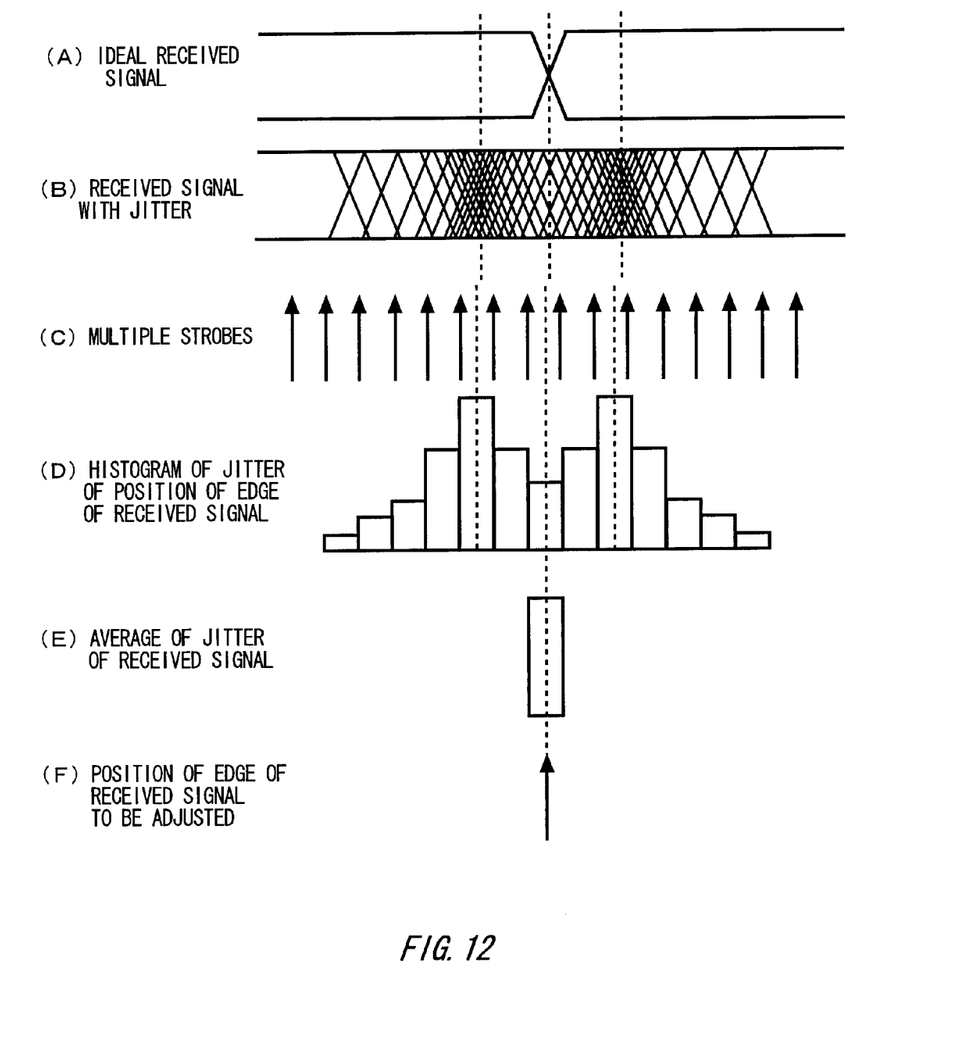
FIG. 12 illustrates, as an example, the relation between a received signal containing jitter and a detected edge.

FIG. 12 illustrates, as an example, the relation between a received signal containing jitter and a detected edge. More specifically, (A) shows an ideal received signal, (B) shows a received signal with jitter, (C) shows multiple strobes, (D) shows an exemplary histogram of the jitter of the position of the edge of the received signal, (E) shows the averaged position of the edge of the received signal with jitter, and (F) shows the position of the edge of the received signal to be adjusted.

The position of the edge of the received signal contains jitter. In the histogram of the jitter, the jitter may peak at different positions than the position of the edge, for example, as shown in FIG. 12(D). Even in this case, the position of the edge of the ideal received signal can be detected by averaging the positions of the edges of the received signal which are detected in more than one cycle, as shown in FIG. 12 (E).

Thus, the detecting section 38 detects the position of the edge of the received signal relative to the multiple strobes in each of multiple cycles of the recovered clock, based on the values of the received signal at the respective timings of the multiple strobes in each cycle. The detecting section 38 determines the position of the edge of the received signal to be adjusted, by referring to the positions of the edges of the received signal, which are each defined relative to the multiple strobes, detected in the multiple cycles.

For example, the detecting section 38 determines the position of the edge of the received signal to be adjusted, by averaging the positions of the edges of the received signal detected in the multiple cycles. Here, the detecting section 38 may determine the position of the edge of the received signal to be adjusted, by obtaining a moving average for the positions of the edges of the received signal. In this way, the clock generating apparatus 20 can generate a recovered clock in more accurate synchronization with the position of the edge of the received signal.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, specification, or drawings, it does not necessarily mean that the process must be performed in this order.

What is claimed is:

1. A clock generating apparatus for generating a recovered clock by recovering a clock from an edge of a received signal, comprising:

a recovered clock generating section that generates the recovered clock;

a multi-strobe generating section that generates a plurality of strobes with different phases, in accordance with a pulse of the recovered clock;

a detecting section that detects a position of an edge of the received signal relative to the strobes, by referring to values of the received signal obtained at respective timings of the strobes;

an adjusting section operable to adjust a phase of the recovered clock, in accordance with the position of the edge of the received signal, by shifting the phase of the recovered clock by a time corresponding to a difference between a position of one of the strobes that detects the position of the edge of the received signal and a position of a predetermined boundary strobe selected from among the strobes; and a storage section that stores therein a reference time amount by which the adjusting section shifts the phase of the recovered clock, wherein the adjusting section is operable to shift the phase of the recovered clock by the reference time amount in such a manner that the position of the boundary strobe approaches the position of the edge of the received signal, if a predetermined reference difference is exceeded by the difference between (i) the position of the strobe that detects the position of the edge of the received signal and (ii) the position of the predetermined boundary strobe, then the adjusting section shifts the phase of the recovered clock by the time corresponding to the difference, and if the predetermined reference difference is not exceeded by the difference between (i) and (ii), then the adjusting section shifts the phase of the recovered clock by the reference time amount in such a manner that the position of the boundary strobe approaches the position of the edge of the received signal.

2. The clock generating apparatus as set forth in claim 1, wherein when a change among the values of the received signal is not detected between any two adjacent ones of the strobes, the adjusting section delays or advances the phase of the recovered clock relative to the received signal.

3. The clock generating apparatus as set forth in claim 2, wherein when the change among the values of the received signal is not detected between any two adjacent strobes, the adjusting section delays or advances the phase of the recovered clock relative to the received signal by a time less than a time interval between an initial strobe and a last strobe of the strobes.

4. The clock generating apparatus as set forth in claim 1, wherein when shifting the phase of the recovered clock by the reference time amount has reversed a temporal order of the position of the edge of the received signal and the position of the boundary strobe, the adjusting section halves the reference time amount stored in the storage section.

5. The clock generating apparatus as set forth in claim 1, wherein when having delayed or advanced the phase of the recovered clock successively by the same reference time amount a predetermined number of times, the adjusting section doubles the reference time amount stored in the storage section.

6. The clock generating apparatus as set forth in claim 1, wherein when two or more edges of the received signal are detected by a set of the strobes, the adjusting section adjusts a position of a predetermined boundary strobe selected from among the strobes, so that the position of the predetermined boundary strobe is aligned with a position of an n-th edge from first or last, from among the detected two or more edges, and n is a predetermined number.

7. The clock generating apparatus as set forth in claim 1, wherein the detecting section:

in each of a plurality of cycles of the recovered clock, detects the position of the edge of the received signal relative to the strobes, by referring to the values of the received signal at the respective timings of the strobes; and determines the position of the edge of the received signal that is to be adjusted, by referring to the positions of the edges of the received signal, which are each defined relative to the strobes, detected in the cycles.

8. The clock generating apparatus as set forth in claim 7, wherein the detecting section determines the position of the edge of the received signal that is to be adjusted, by averaging the positions of the edges of the received signal, which are each defined relative to the strobes, detected in the cycles.

9. A test apparatus for testing a device under test, comprising:

a clock generating apparatus that generates a recovered clock by recovering an edge of a received signal received from the device under test, the clock generating apparatus including:

a recovered clock generating section that generates the recovered clock;

a multi-strobe generating section that generates a plurality of strobes with different phases, in accordance with a pulse of the recovered clock;

a detecting section that detects a position of an edge of the received signal relative to the strobes, by referring to values of the received signal obtained at respective timings of the strobes;

an adjusting section that adjusts a phase of the recovered clock, in accordance with the position of the edge of the received signal, by shifting the phase of the recovered clock by a time corresponding to a difference between (i) a position of one of the strobes that detects the position of the edge of the received signal and (ii) a position of a predetermined boundary strobe selected from among the strobes; and a storage section that stores therein a reference time amount by which the adjusting section shifts the phase of the recovered clock, wherein the test apparatus further comprises:

a receiving section that receives at least one of the received signal and a parallel signal transmitted from the device under test in parallel with the received signal, in accordance with the recovered clock; and a judging section that judges whether the signal received by the receiving section is acceptable, the adjusting section is operable to shift the phase of the recovered clock by the reference time amount in such a manner that the position of the boundary strobe approaches the position of the edge of the received signal, if a predetermined reference difference is exceeded by the difference between (i) the position of the strobe that detects the position of the edge of the received signal and (ii) the position of the predetermined boundary strobe, then the adjusting section shifts the phase of the recovered clock by the time corresponding to the difference, and if the predetermined reference difference is not exceeded by the difference between (i) and (ii), then the adjusting section shifts the phase of the recovered clock by the reference time amount in such a manner that the position of the boundary strobe approaches the position of the edge of the received signal.

10. A clock generating method performed by a clock generating apparatus for generating a recovered clock by recovering a clock from an edge of a received signal, the clock generating method comprising:

generating the recovered clock by a recovered clock generating section of the clock generating apparatus;

generating, by a multi-strobe generating section of the clock generating apparatus, a plurality of strobes with different phases, in accordance with a pulse of the recovered clock;

detecting, by a detecting section of the clock generating apparatus, a position of an edge of the received signal relative to the strobes, by referring to values of the received signal at respective timings of the strobes;

adjusting, by an adjusting section of the clock generating apparatus, a phase of the recovered clock in accordance with the position of the edge of the received signal, by shifting the phase of the recovered clock by a time corresponding to a difference between a position of one of the strobes that detects the position of the edge of the received signal and a position of a predetermined boundary strobe selected from among the strobes; and storing, in a storage section of the clock generating apparatus, a reference time amount by which the phase of the recovered clock is shifted, wherein if a predetermined reference difference is exceeded by the difference between (i) the position of the strobe that detects the position of the edge of the received signal and (ii) the position of the predetermined boundary strobe, then the phase of the recovered clock is shifted by the time corresponding to the difference, and if the predetermined reference difference is not exceeded by the difference between (i) and (ii), then the phase of the recovered clock is shifted by the reference time amount in such a manner that the position of the boundary strobe approaches the position of the edge of the received signal.

* * * * *